United States Patent [19]

Kosonocky et al.

[11] Patent Number: 4,665,420

[45] Date of Patent: May 12, 1987

[54] EDGE PASSIVATED CHARGE-COUPLED DEVICE IMAGE SENSOR

[75] Inventors: Walter F. Kosonocky, Montgomery Township, Somerset County; Hammam Elabd, East Windsor Township, Mercer County, both of N.J.

[73] Assignee: RCA Corporation, Princeton, N.J.

[21] Appl. No.: 669,344

[22] Filed: Nov. 8, 1984

[51] Int. Cl.⁴ .................... H01L 29/78; H01L 27/14; H01L 27/02; H01L 29/34
[52] U.S. Cl. ........................................ 357/24; 357/30; 357/41; 357/23.11; 357/52
[58] Field of Search ................ 357/24, 24 LR, 24 M, 357/30, 23.11, 41, 45, 52; 377/64

[56] References Cited

U.S. PATENT DOCUMENTS

| | | | |
|---|---|---|---|
| 3,772,576 | 11/1973 | Nienhuis et al. | 357/52 |
| 3,896,485 | 7/1975 | Early | 357/24 LR |
| 4,118,794 | 10/1978 | Mizuno et al. | 357/23.6 |
| 4,163,245 | 7/1979 | Kinoshita | 357/23.6 |
| 4,362,575 | 12/1982 | Wallace | 148/1.5 |
| 4,396,438 | 8/1983 | Goodman | 357/24 M |

OTHER PUBLICATIONS

Patent application of E. D. Savoye et al., Ser. No. 455,332, filed Jan. 3, 1983, "Imaging Array Having High Sensitivity and Method of Making the Same".
Patent application of H. Elabd et al., Ser. No. 590,888, filed Mar. 16, 1984, "High Resolution CCD Imagers".
Patent Application of W. F. Kosonocky, Ser. No. 589,778, filed Mar. 15, 1984, "CCD Imager and Method of Making the Same".

Primary Examiner—Martin H. Edlow
Assistant Examiner—Robert P. Limpanek
Attorney, Agent, or Firm—Joseph S. Tripoli; Donald S. Cohen

[57] ABSTRACT

A charge-coupled device (CCD) image sensor includes in a substrate of single crystalline silicon of one conductivity type an array of a plurality of spaced, parallel channel regions of the opposite conductivity type extending along one major surface of the substrate. A plurality of parallel conductive gates are over the one major surface of the substrate and extend transversely across the channel regions. The outermost channel regions of the array are positioned adjacent edges of the substrate so that a plurality of the image sensors can be mounted in edge-to-edge relation with the channel regions of the various sensors being close together. The sensor includes passivating means between each outermost channel region and the adjacent edge to prevent charge carriers generated by the edge from being injected into the outermost channel region. The passivating means includes a highly conductive drain region of a conductivity type opposite to that of the substrate within the substrate and extending along the one major surface between the outermost channel region and the edge. Also, a highly conductive region of the same conductivity type as the substrate is on the substrate and extends along the one major surface directly at the edge.

5 Claims, 4 Drawing Figures

EDGE PASSIVATED CHARGE-COUPLED DEVICE IMAGE SENSOR

The invention described herein was made in performance of work under NASA Contract No. NAS 5-27505 and is subject to the provisions of Section 305 of the National Aeronautics and Space Act of 1958 (72 Stat. 435, 42 U.S.C. 2457).

The present invention relates to an edge passivated charge-coupled device (CCD) image sensor and more particularly to a CCD image sensor in which the edge of the substrate on which the sensor is formed is close to the CCD array and the CCD array is protected from charges developed at the substrate edge.

BACKGROUND OF THE INVENTION

A frame transfer CCD image sensor in general include three parts: a photosensing array, known as the A-register; a temporary storage array, known as the B-register; and an output register, known as the C-register. In one type of CCD image sensor the A-register includes a plurality of spaced, parallel buried-channel regions in the form of regions of N— type conductivity formed in a substrate of single crystalline silicon of P— type conductivity and extending along a surface of the substrate. A plurality of parallel gates of a conductive material, such as conductive polycrystalline silicon, extends transversely across the channels and are insulated from the surface of the substrate by a layer of silicon oxide. The B-register likewise includes a plurality of spaced, parallel buried-channels which are extensions of the channels of the A-register. A plurality of spaced, parallel conductive gates extend transversely the channels of the B-register. The C-register includes a single buried channel extending across the ends of the B-register channels and a plurality of conductive gates extending transversely across the channel. The A-register and the B-register include channel stops extending between the channels to isolate the channels. The A-register can also include blooming drains between the channels. Such blooming drains are disclosed in U.S. Pat. No. 4,362,575 to L. F. Wallace, issued Dec. 7, 1982 entitled "Method of Making a Buried-Channel Charge-Coupled Devices With Means For Controlling Excess Charge" and the patent application of E. D. Savoye et al., Ser. No. 455,332, filed Jan. 3, 1983 entitled "Imaging Array Having High Sensitivity And Method of Making The Same", and assigned to the same assignee as the present application.

There are some uses for CCD image sensors, such as for surveillance in space or high resolution television imaging, which require the use of a plurality of the image sensors mounted in side-by-side abutting relation so as to be capable of sensing a large area. For such a use, it is desirable that the edge of a substrate be as close as possible to the sides of the A-register, the CCD sensing area, so that when the sensors are mounted together the A-registers of the various sensors will be as close as possible to minimize dead space between the individual sensors. However, it has been found that charge carriers are generated at the edges of the substrate, and, if these charge carriers are injected into the CCD channels, they introduce a fixed pattern noise and may overload the CCD register, thereby adversely affecting the image being detected. Therefore, it is desirable to passivate the edges of the substrate to prevent injection of the undesirable charge carriers into the CCD registers. A type of high resolution CCD imager where this problem can exist is described in the patent application of Hammam Elabd et al., Ser. No. 590,888, filed Mar. 16, 1984 entitled HIGH RESOLUTION CCD IMAGERS, and assigned to the same assignee as the present application.

SUMMARY OF THE INVENTION

An image sensor includes a substrate of single crystalline silicon of one conductivity type having a pair of opposed major surfaces and edges. A sensor array is incorporated in the substrate. The array includes a plurality of space detectors arranged in columns extending along one of the major surfaces of the substrate. At least one of the columns is adjacent an edge of the substrate. In the substrate and between the edge of the substrate and the adjacent column of detectors is means for receiving any charge carriers generated at the edge to prevent the charge carriers from being injected into the adjacent detectors.

DETAILED DESCRIPTION OF PREFERRED EMBODIMENT

Figure 1:
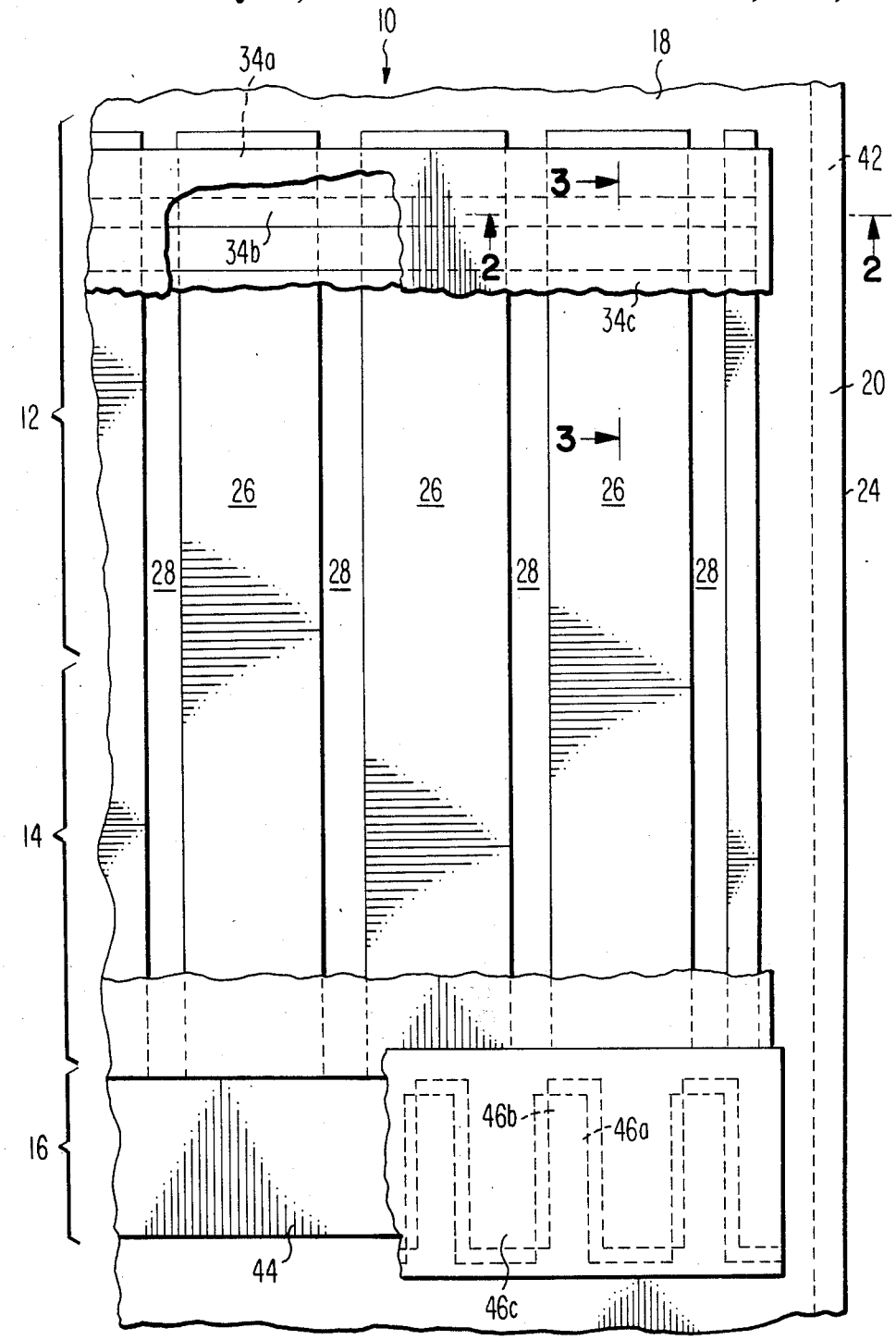
FIG. 1 is a top plan view of a portion of a CCD image sensor which incorporates the present invention.

Referring initially to FIG. 1, a frame transfer CCD image sensor which incorporates the present invention is generally designated as 10. The CCD image sensor 10 includes a photosensing array 12, known as an A-register, a temporary storage array 14, known as a B-register, and an output register 16 known as a C-register. The B- and C-registers 14 and 16 are masked, that is, means (not shown) are provided for preventing a radiant energy image from reaching either register.

The CCD image sensor 10 is formed in and along a substrate 18 of single crystalline silicon of P type conductivity. The substrate 18 has a pair of opposed major surfaces 20 and 22 and an outer edge 24.

Figure 2:
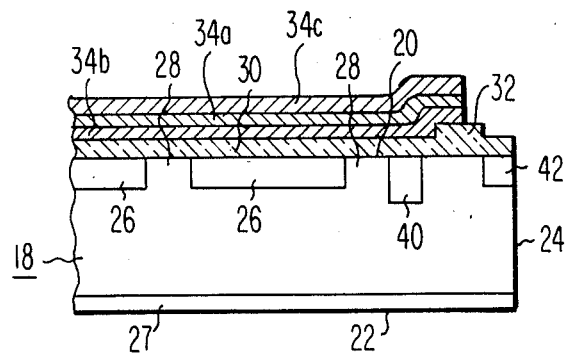
FIG. 2 is a sectional view taken along line 2—2 of FIG. 1.

As shown in FIGS. 1 and 2, the A-register 12 includes a plurality of spaced, parallel buried-channels 26 of N type conductivity within the substrate 18 and extending along the surface 20. The channels 26 are arranged across the substrate 18 with the outermost channels 26 being adjacent an edge 24 of the substrate 18. Between the channels 26 and on the outer side of the outermost channels 26 are barrier regions 28 of P type conductivity. If desired, blooming drains of N type conductivity (not shown) can be provided on each side of each of the channels 26. Such blooming drains are shown in the previously referred to Wallace U.S. Pat. No. 4,362,575 and the Savoye et al. patent application Ser. No. 455,332, which are incorporated herein by reference.

As shown in FIG. 2, a channel layer 30 of silicon oxide is on the substrate surface 20 and extends over the channels 26 and barrier regions 28. The channel oxide layer 30 is relatively thin, about 1500 angstroms in thickness. Around the channel oxide layer 30 is a field layer 32 of silicon oxide. The field oxide layer 32 is thicker than the channel oxide layer 30.

Figure 3:
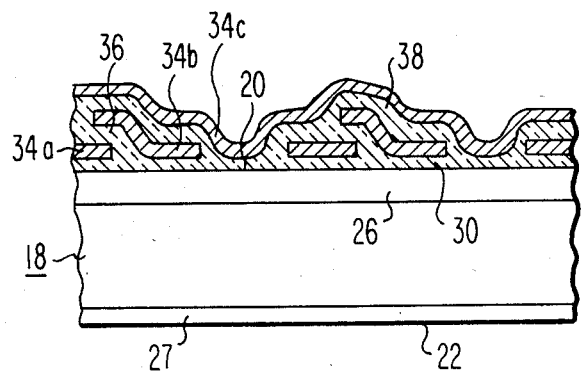
FIG. 3 is a sectional view taken along line 3—3 of FIG. 1.

As shown in FIG. 3, a first set of spaced, parallel gates 34a are on the channel oxide 30 and extend transversely across the channels 26 in a manner well-known in the art of CCD image sensors. A second set of spaced, parallel gates 34b are on the channel oxide layer 30 and extend transversely across the channels 26 with each second gate 34b being between a pair of first gates 34a. Each of the second gates 34b overlaps a portion of an adjacent first gate 34a and is insulated from the first gate 34a by a layer 36 of silicon oxide. A separate third gate 34c is on the channel oxide layer 30 between each of the second gates 34b and the first gate 34a of the adjacent set of gates. The third gates 34c are part of a single layer which extends over the first and second gates 34a and 34b and which is insulated therefrom by a layer 38 of silicon oxide. The gates 34a, 34b and 34c are of an electrically conductive material, such as doped polycrystalline silicon. The first gates 34a are electrically connected together by a terminal at one edge of the array, and the second gates 34b are likewise electrically connected together by a terminal at one edge of the array. Since the third gates 34c are all part of a single layer, they are also electrically connected together.

To passivate the channels 26 from the edges 24 of the substrate 18, a separate drain 40 is within the substrate 18 between each of the outermost channels 26 and the adjacent edge 24 of the substrate 18 as shown in FIG. 2. The drains 40 are high conductivity regions of a conductivity type opposite to that of the substrate 18 and extend along the substrate surface 20 parallel to the edges 24 of the substrate 18 and surround the active sensor area. The drains 40 usually extend into the substrate 18 from the surface 20 a distance greater than the depth of the channels 26 and depletion regions corresponding to the drains 40 are controlled by the bias voltage applied to the drains 40. A high conductivity region 42 of the same conductivity type as that of the substrate 18 is within the substrate 18 and extends along the entire length of the edge 24 of the substrate 18.

The B-register 14 is of a structure similar to that of the A-register 12 in that it includes a plurality of spaced, parallel channels which are extensions of the channels 26 of the A-register 12 with barrier regions between the channels and on the outsides of the outer channels which are extensions of the barrier regions 28 of the A-register 12. The channel oxide layer 30 also extends over the channels and barrier regions of the B-register 14. Three sets of gates, which are of the same construction as the gates 34a, 34b and 34c of the A-register 12, extends transversely across the channels of the B-register 14. The drains 40 extend along the outer channels of the B-register and the high conductivity region 42 also extends along the B-register.

The C-register 16 includes a channel 44 of a conductivity type opposite to that of the substrate 18 within the substrate 18 and extending along the surface 20 across the ends of the B-register channels. The channel oxide layer 30 also extends over the C-register channel 44 and the field oxide layer 32 extends along the lower edge of the channel 44. A first set of spaced, parallel gates 46a are on the field oxide layer 32 and extend transversely across the channel 44. A second set of spaced, parallel gates 46b are on the field oxide layer 32 and extend transversely across the channel 44 between the first gates 48. Each of the second gates 46b partially overlaps an adjacent first gate 46a. Third gates 46c are on the field oxide layer 32 between each of the second qates 46b and the first gate 46a of the next set. The first gates 46a are connected together along one edge of the channel 44 and the second gates 46b are all connected together along one edge of the channel 44. The third gates 46c are formed from a single layer. All of the gates 46a, 46b and 46c are of a conductive material, such as doped polycrystalline silicon. As shown in FIGS. 2 and 3, the substrate 18 has a thin, highly conductive region 48 extending along the surface 22 thereof.

In the operation of the sensor 10, any charge generated at the edges 24 of the substrate 18 will tend to be intercepted by the depletion region of the edge drains 40 and thus will flow into the drains 40 and be prevented from reaching the outermost channels 26. The highly conductive region 42 along the edges 24 serve to prevent the formation of the depletion region from extending to the very edge 24 of the substrate 18, which could result in an excessively large edge drain current.

Figure 4:
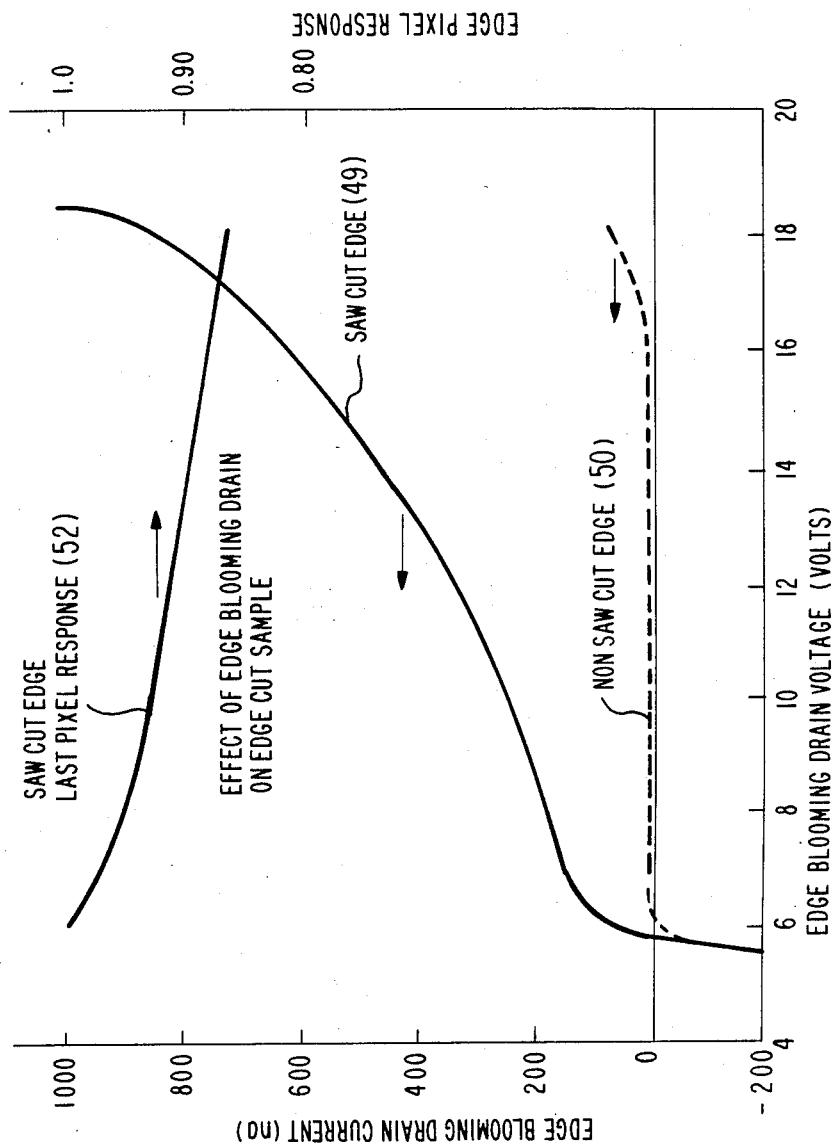
FIG. 4 is a graph showing the effect of the use of the present invention.

The data for the graphs shown in FIG. 4 was obtained from a sensor array of the construction shown in the previously referred to application of Hammam Elabd et al., Ser. No. 590,888 which included an edge drain 40 of the present invention. In the graph of FIG. 4, line 48 shows the edge drain current versus voltage for a sensor 10 of the present invention having the substrate edges 24 close to the channels 26, about 10 microns from the edge. As shown by line 48, as the edge drain voltage is increased, the current increases, indicating that current flows in the drain 40. Line 50 is the edge drain current versus voltage for a sensor having the edge of the substrate spaced away from the drain 40. It can be seen from line 50 that as the edge drain voltage is increased the edge drain current does not increase when the edge of the substrate is spaced from the drain. From lines 48 and 50 it can be seen that the edge of the substrate being close to the drain does generate a charge which flows into the drain.

Line 52 shows any change in response of the outermost channels 26 (the last pixel of the sensor array) for a sensor which incorporates the present invention with the edge of the substrate being close to the drain. Line 52 indicates that the response of the last pixel, which is the pixel which could be affected by edge generated charges, is still 100% for voltages of 6 volts even though, as shown by line 48, there are edge generated charges which are collected in the edge drain 40. Although line 52 shows that the last pixel response decreases at drain voltages above 6 volts, this is a result of the expansion of the depletion region of the edge drain which tends to rob the last pixel of the detected optical signal, and can be compensated for. The compensation can be accomplished either by increasing the size of the last pixel or by increasing the distance between the last pixel and the edge drain 40. Thus, when the image array is operated with a drain voltage of no greater than 6 volts, the drains 40 passivate the edges of the sensor 10 by preventing charges generated by the edge 24 from reaching the outermost channels 26 (the last pixel). This permits the sensors 10 to be made in substrates 18 having side edges close to the outermost channels 26 so that when a plurality of the sensors 10 are mounted in side-by-side relation the outermost channels of the various adjacent sensors will be relatively close together. If the sensor must be operated with the drain voltage above 6 volts, the same effect can be achieved by an appropriate compensation as previously described.

Although the sensor is shown with the edge drain 40 under the gates, the edge drain 40 can be formed outside the gates and self-aligned with the ends of the gates. However, this structure would increase the spacing between the outermost CCD channel and the edge 24 of the substrate 18. Also, the edge drain 40 can be provided with a barrier region along one or both sides thereof. The barrier region is a region of the same conductivity type as that of the drain region but of lower conductivity. A barrier region along the sides of the drain can be most effectively formed when making a sensor having blooming drains, such as described in the Wallace U.S. Pat. No. 4,362,575. In addition, the data shown in FIG. 4 was obtained from a sensor formed in a substrate having a resistivity of 10 ohm-cm and then to a thickness of about 10 microns. In principle the edge drain of the present invention could be even more effective if the substrate was of higher resistivity which would allow the depletion region around the edge drain to extend completely across the thickness of the 10 micron thick substrate to a very shallow (about 500 angstroms) P+ layer 27 at the back surface 22 of the substrate 18.

Although the sensor has been shown as being in the form of a frame transfer CCD imager sensor, the present invention can also be used with a line transfer CCD imager. Also, the present invention can be used in imagers in which the detectors are for structures other than CCD detectors, such as Schottky-barrier detectors.

Thus there is provided by the present invention an edge passivation for a CCD image sensor which allows the buried channels of the CCD to be positioned close to the edges of the substrate in which the device is formed but prevents any charges developed at the edge from reaching the buried channels which would disrupt the image being detected. This allows several of the CCD image sensors to be mounted in edge-to-edge relation.

We claim:

1. An image sensor comprising
    a substrate of single crystalline silicon of one conductivity type having a pair of opposed major surfaces and edges,
    a sensor array incorporated in said substrate, said array including a plurality of detectors extending in parallel columns along one of said major surface, at least one of said columns being adjacent an edge of the substrate,
    a drain means in said substrate between said edge of the substrate and the adjacent column of detectors for receiving any charge carriers generated at said edge to prevent charge carriers from being injected into said adjacent detectors, and
    a highly conductive region of the same conductivity type as the substrate within the substrate and extending along said one surface directly at said edge for preventing the depletion region caused by generated charges from extending to said edge.

2. An image sensor in accordance with claim 1 in which the drain is a high conductivity region of a conductivity type opposite to that of the substrate within the substrate and extending along said one major surface.

3. An image sensor in accordance with claim 1 in which the sensor array includes a plurality of spaced channel regions of a conductivity type opposite to that of the substrate within the substrate and extending along said one major surface with at least one of said channels being adjacent the edge of the substrate and a plurality of conductive gates extending across said major surface and transversely across the channels.

4. An image sensor in accordance with claim 3 in which the drain is a high conductivity region of a conductivity type opposite to that of the substrate within the substrate and extending along said one major surface.

5. An image sensor in accordance with claim 4 including a high conductivity region along the other major surface of the substrate and means whereby the depletion region of the drain can extend through the thickness of the substrate to the high conductivity region.

* * * * *